(12) United States Patent
Kerman

(10) Patent No.: US 10,283,693 B2
(45) Date of Patent: May 7, 2019

(54) MULTILOOP INTERFEROMETERS FOR QUANTUM INFORMATION PROCESSING

(71) Applicant: Massachusetts Institute of Technology, Cambridge, MA (US)

(72) Inventor: Andrew J. Kerman, Arlington, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 82 days.

(21) Appl. No.: 15/354,275

(22) Filed: Nov. 17, 2016

(65) Prior Publication Data

US 2017/0141286 A1    May 18, 2017

Related U.S. Application Data

(60) Provisional application No. 62/256,191, filed on Nov. 17, 2015.

(51) Int. Cl.
  *H03K 17/92* (2006.01)
  *H01L 39/02* (2006.01)
  *G06N 10/00* (2019.01)

(52) U.S. Cl.
  CPC .......... *H01L 39/025* (2013.01); *G06N 10/00* (2019.01)

(58) Field of Classification Search
  CPC .......... H03K 17/92; H03K 3/38; B82Y 10/00; G06N 99/002; H01L 39/223
  USPC ................................. 327/367, 528
  See application file for complete search history.

(56) References Cited

U.S. PATENT DOCUMENTS

| 4,621,203 | A | * | 11/1986 | Sweeny | ................ | H01F 36/00 257/30 |
| 5,768,297 | A | | 6/1998 | Shor | | |
| 5,942,997 | A | * | 8/1999 | Silver | .................. | H03M 1/121 341/133 |
| 6,627,915 | B1 | | 9/2003 | Ustinov et al. | | |
| 6,734,699 | B1 | * | 5/2004 | Herr | .................... | H03K 19/1952 326/1 |
| 8,018,244 | B2 | * | 9/2011 | Berkley | ................. | B82Y 10/00 326/1 |
| 8,174,305 | B2 | | 5/2012 | Harris | | |
| 8,179,133 | B1 | | 5/2012 | Kornev et al. | | |
| 8,854,074 | B2 | * | 10/2014 | Berkley | ............... | G06N 99/002 326/3 |
| 9,812,836 | B1 | * | 11/2017 | Osborn | ...................... | H01S 3/02 |

(Continued)

FOREIGN PATENT DOCUMENTS

CN          103227800 A      7/2013

OTHER PUBLICATIONS

U.S. Final Office Action dated Feb. 9, 2018 for U.S. Appl. No. 15/354,286; 17 Pages.

(Continued)

*Primary Examiner* — Anh Q Tra
(74) *Attorney, Agent, or Firm* — Daly, Crowley, Mofford & Durkee LLP

(57) ABSTRACT

Structures and techniques, using superconducting Josephson-junction based circuits, to directly engineer physical multiqubit (or "many-qubit") interactions in a non-perturbative manner. In one embodiment, a system for multiqubit interaction includes: a multispin coupler including a plurality of loops, each loop having a pair of Josephson junctions; and a plurality of qubits each inductively coupled to the multispin coupler.

10 Claims, 4 Drawing Sheets

(56) References Cited

U.S. PATENT DOCUMENTS

| | | | |
|---|---|---|---|
| 2004/0012407 A1 | 1/2004 | Amin et al. | |
| 2004/0095803 A1 | 5/2004 | Ustinov | |
| 2004/0135139 A1 | 7/2004 | Koval et al. | |
| 2005/0273306 A1 | 12/2005 | Hilton et al. | |
| 2006/0147154 A1 | 7/2006 | Thom et al. | |
| 2006/0225165 A1 | 10/2006 | Maassen van den Brink et al. | |
| 2007/0241747 A1 | 10/2007 | Morley et al. | |
| 2008/0274898 A1 | 11/2008 | Johnson et al. | |
| 2009/0182542 A9 | 7/2009 | Hilton et al. | |
| 2009/0321720 A1 | 12/2009 | Rose | |
| 2010/0194466 A1 | 8/2010 | Yorozu et al. | |
| 2011/0018612 A1 | 1/2011 | Harris | |
| 2011/0065586 A1 | 3/2011 | Maibaum et al. | |
| 2012/0071333 A1 | 3/2012 | Kauffman et al. | |
| 2014/0097405 A1 | 4/2014 | Bunyk | |
| 2015/0032994 A1 | 1/2015 | Chudak et al. | |
| 2015/0111754 A1 | 4/2015 | Harris et al. | |
| 2015/0310350 A1* | 10/2015 | Niskanen | G06N 99/002 706/46 |
| 2016/0335560 A1 | 11/2016 | Mohseni et al. | |
| 2017/0140296 A1* | 5/2017 | Kerman | G06N 99/002 |
| 2017/0177534 A1 | 6/2017 | Mohseni et al. | |
| 2018/0218279 A1 | 8/2018 | Lechner et al. | |

OTHER PUBLICATIONS

Andrew J. Kerman; QEO Overview; PowerPoint Presentation Presented on Jun. 28, 2015 at the QEO Satellite Meeting of the Fourth Conference in Adiabatic Quantum Computing (AQC 2015); 11 Pages.
Andrew J. Kerman et al., "IARPA Quantum Enhanced Optimization (QEO) Study;" Presented on Oct. 26, 2015 and Jan. 20, 2016 at the IARPA BAA QEO Proposer's Days Briefings; 33 Pages.
Response to Office Action dated Aug. 3, 2017 filed on Nov. 3, 2017 for U.S. Appl. No. 15/354,286; 11 pages.
Response to U.S. Final Office Action dated Feb. 9, 2018 for U.S. Appl. No. 15/354,286; Response filed on Apr. 23, 2018; 8 pages.
Certificate and Request for Consideration Under the After Final Consideration Pilot Program 2.0 filed Apr. 23, 2018 for U.S. Appl. No. 15/354,286: 2 pages.
PCT International Search Report and Written Opinion dated Jan. 19, 2017 for International Application No. PCT/US2016/062461; 8 Pages.
Wendin et al., "Superconducting Quantum Circuits, Qubits and Computing" dated Feb. 2, 2008; Retrieved from the Internet https://arxiv.org/pdf/cond-mat/0508729.pdf; 60 pages.
PCT International Search Report and Written Opinion dated Jan. 31, 2017 for International Application No. PCT/US2016/062456; 10 Pages.
Courtland; "Google Aims for Quantum Computing Supremacy;" Spectrum.IEEE.Org; North America; Jun. 2017; 2 pages.
Filippov, et al.; "Tunable Transfolrmer for Qubits Based on Flux States;" IEEE Transactions on Applied Superconductivity; vol. 13; No. 2; Jun. 2003; 4 pages.
Office Action for U.S. Appl. No. 15/354,286 dated Aug. 3, 2017; 16 pages.
Kerman et al., "High-Fidelity Quantum Operations on Superconducting Qubits in the Presence of Noise;" Physical Review Letters, PRL 101, 070501; Aug. 15, 2008; 4 Pages.
U.S. Appl. No. 15/976,291, filed May 10, 2018, Kerman.
PCT International Preliminary Report on Patentability dated May 31, 2018 for International Application No. PCT/US2016/062456; 6 Pages.
Notice of Allowance dated Oct. 11, 2018, for U.S. Appl. No. 15/976,291; 15 Pages.
Response to U.S. Non-Final Office Action dated Sep. 13, 2018 for U.S. Appl. No. 15/354,286; Response filed on Oct. 9, 2018; 9 Pages.
U.S. Final Office Action dated Nov. 29, 2018 for U.S. Appl. No. 15/354,286; 10 Pages.
Non-Final Office Action dated Sep. 13, 2018 for U.S. Appl. No. 15/354,286; 16 Pages.
Response to Office Action dated Nov. 29, 2018 for U.S. Appl. No. 15/354,286, filed Jan. 4. 2019; 5 pages.

* cited by examiner

MULTILOOP INTERFEROMETERS FOR QUANTUM INFORMATION PROCESSING

CROSS REFERENCE TO RELATED APPLICATION

This application claims the benefit under 35 U.S.C. § 119(e) of U.S. Provisional Application No. 62/256,191 filed Nov. 17, 2015, which application is incorporated herein by reference in its entirety.

STATEMENT REGARDING FEDERALLY SPONSORED RESEARCH

This invention was made with government support under Contract No. FA8721-05-C-0002 awarded by the U.S. Air Force. The Government has certain rights in the invention.

BACKGROUND

Multiqubit quantum entanglement is a central physical resource on which the non-classical computational power of quantum information technology is based. As a result of this, known quantum information processing methods with the potential to achieve substantial performance improvement over classical techniques are built on methods for producing and exploiting large-scale quantum entanglement. The two most well-known quantum-processing paradigms are: digital quantum computing, which is expected to provide exponential performance enhancement most notably for problems in cryptography (Shor's algorithm) and quantum simulation of chemical and biological molecules (quantum phase estimation algorithm); and quantum annealing, where engineered quantum fluctuations may provide qualitative enhancement in the heuristic sampling of classical optimization problems.

In both of these quantum-processing paradigms, the machinery for construction and maintenance of large-scale quantum entanglement relies on pairwise interactions between qubits. Larger-scale entanglement is then built up by combining many of these pairwise interactions, either by applying them successively in time in a pulsed manner, or by engineering many static pairwise interactions simultaneously to obtain an effective higher-order interaction perturbatively. This is largely limited by physical hardware constraints: two-qubit interactions are the only physical-level entangling operations that have yet been demonstrated in any qubit modality.

SUMMARY

It is appreciated herein that multiqubit interactions have engineering potential for improving the performance and scalability of quantum information processing systems. For example, in the case of digital quantum computing using topological encoding for fault-tolerance, the fundamental interactions that are required involve four qubits. Realizing this with two-qubit interactions requires four individual two-qubit gates, and introduces an entirely new class of error processes relative to the idealized case. Block encoding in these schemes, which promises even higher performance, requires even higher-order interactions (e.g., involving more than four qubits). For quantum annealing, the realization of large-scale entanglement using two-spin interactions only (as in some existing commercial quantum information processing systems) is exponentially inefficient in the number of spins involved, and this is an important reason that no evidence for quantum-enhanced performance has yet been observed in these machines.

Described herein are structures and techniques, using superconducting Josephson-junction based circuits, to directly engineer physical multiqubit (or "many-qubit") interactions in a non-perturbative manner.

According to one aspect of the disclosure, a system for multiqubit interaction includes: a multispin coupler including a plurality of loops, each loop having a pair of Josephson junctions; and a plurality of qubits each inductively coupled to the multispin coupler. In some embodiments, each loop of the multispin coupler includes an inductive element coupled between the pair of Josephson junctions and an energy storage element arranged in parallel with a first one of the pair of Josephson junctions. In certain embodiments, the multispin coupler further includes a transformer inductively coupled to each of the plurality of qubits and to each loop of the multispin coupler. In many embodiments, each of the plurality qubits includes a first loop and a second loop, the first and second loop each including a pair of Josephson junctions, the first loop further including an inductive element coupled between the pair of Josephson junctions. In some embodiments, the plurality of qubits includes three or more qubits. In particular embodiments, the multispin coupler can be configured to operate in either an energy mode or a current mode, wherein in energy mode a total potential energy within the multispin coupler is proportional to a parity operator over each of the plurality of qubits, wherein current mode a total current circulating within the multispin coupler is proportional to the parity operator over each of the plurality of qubits. In many embodiments, the multispin coupler can be configured to operate in either an energy mode or a current mode by adjusting a magnetic flux through one or more of the loops of the multispin coupler.

According to another aspect of the disclosure, a system for multiqubit interaction includes: a first multispin coupler; a plurality of second multispin couplers each inductively coupled to the first multispin coupler, wherein the first multispin coupler and each of the plurality of second multispin couplers include a plurality of loops, each loop having a pair of Josephson junctions; and a plurality of qubits coupled to each of the second multispin couplers.

In some embodiments, each of the plurality of second multispin couplers is configured to operate in an energy mode whereby a total potential energy within each of the plurality of second multispin couplers is proportional to a parity operator over each of the plurality of qubits coupled thereto, wherein the first multispin coupler is configured to operate in a current mode whereby a total current circulating within the first multispin coupler is proportional to a parity operator over each of the plurality of qubits coupled to each of the plurality of second multispin couplers.

In various embodiments, each of the plurality of second multispin couplers is configured to operate in a current mode whereby a total current circulating within each of the plurality of second multispin couplers is proportional to a parity operator over each of the plurality of qubits coupled thereto, and wherein the first multispin coupler is configured to operate in an energy mode whereby the total potential energy within the first multispin coupler is proportional to a parity operator over each of the plurality of qubits coupled to each of the plurality of second multispin couplers.

BRIEF DESCRIPTION OF THE DRAWINGS

The foregoing features may be more fully understood from the following description of the drawings in which.

The drawings are not necessarily to scale, or inclusive of all elements of a system, emphasis instead generally being placed upon illustrating the concepts, structures, and techniques sought to be protected herein.

DETAILED DESCRIPTION

Figure 1:
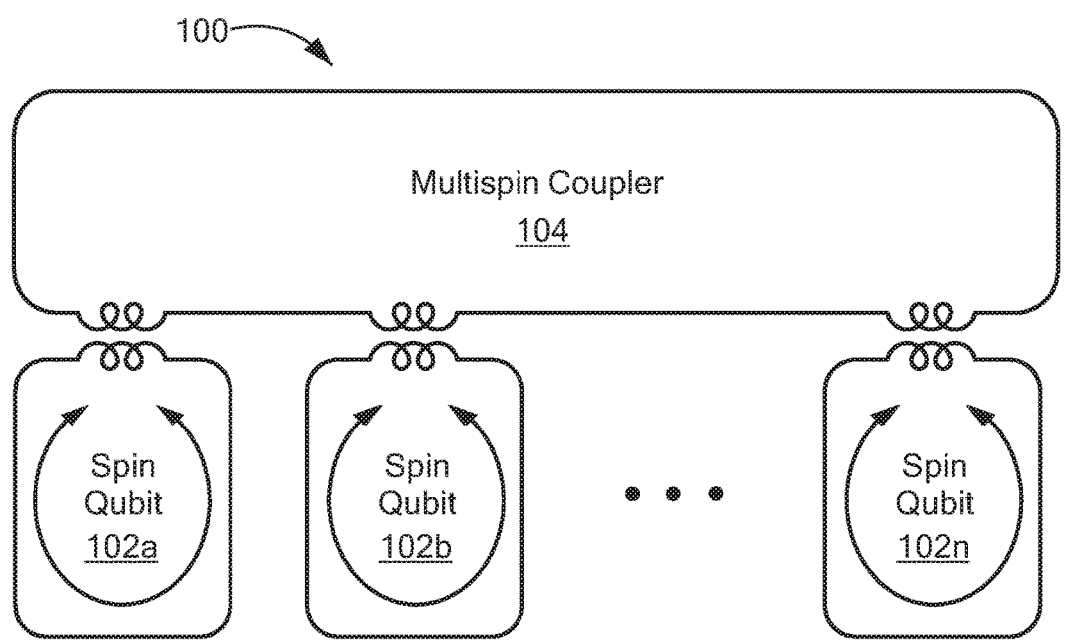
FIG. 1 is a block diagram of a system to provide multi-qubit interactions using a multispin coupler, according to an embodiment of the disclosure.

Referring to FIG. 1, according to an embodiment of the disclosure, a system 100 includes a plurality of qubits 102a-102n (generally denoted 102) and a multispin coupler 104.

In many embodiments, the qubits 102 are provided a flux qubits. As is known, flux qubits (also known as persistent current qubits) are micrometer-sized loops of superconducting metal interrupted by a number of Josephson junctions. The Josephson junction parameters may be fabricated such that a persistent current will flow continuously when an external flux is applied. The computational basis states of the qubit are defined by the circulating currents, which can flow either clockwise or counter-clockwise.

The multispin coupler 104 provides multiqubit (i.e., two or more) interactions in a non-perturbative manner. In some embodiments, the multispin coupler 104 may be provided as a multi-loop circuit.

Figure 2:
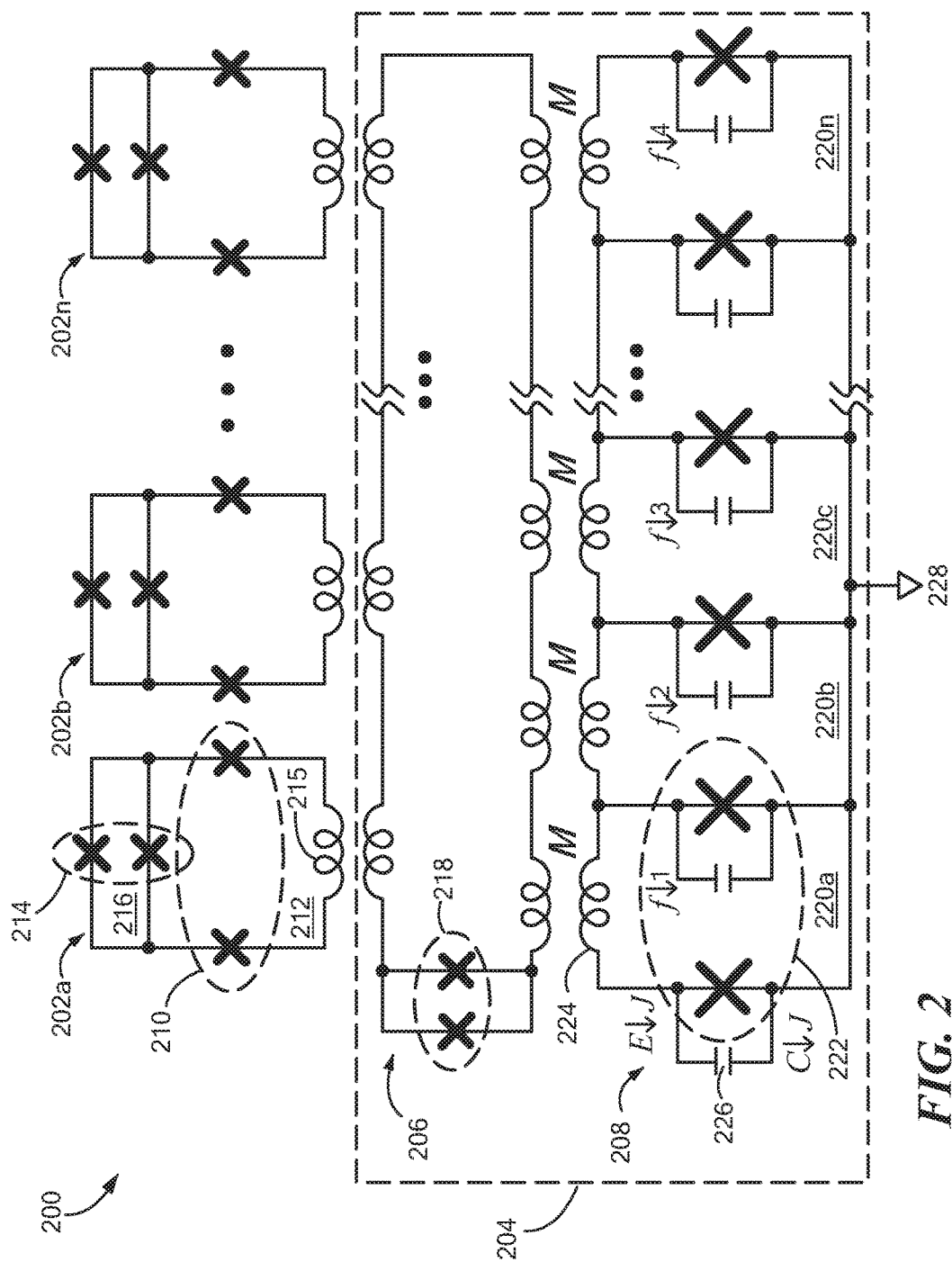
FIG. 2 is a diagram of a circuit to provide multiqubit interactions using a multiloop superconducting quantum interference device (mSQUID), according to another embodiment of the disclosure.

Referring to the embodiment of FIG. 2, a circuit 200 can provide multiqubit interactions using a multispin coupler. The circuit 200 includes a plurality of qubits 202a-202n (202 generally) and a multispin coupler 204 provided as a multiloop DC interferometer (referred to herein as an "mSQUID"). The mSQUID 204 includes a transformer 206 to which each of the qubits 202 may be inductively coupled.

In the embodiment of FIG. 2, the qubits 202 are provided as flux qubits each having two pairs of Josephson junctions (in FIG. 2, individual Josephson junctions are denoted "X"). For example, qubit 202a is denoted as having a first pair of Josephson junctions 210 arranged about a first loop 212, and a second pair of Josephson junctions 214 arranged about a second loop 216.

Each qubit 202 further includes an inductive element 215 to provide inductive coupling with the mSQUID transformer 206. As used herein, the term "inductive element" refers to any circuit element that stores energy in a magnetic field, including linear and nonlinear inductors. In the embodiment of FIG. 2, the qubit inductive element is coupled between the pair of Josephson junctions 210 within the first loop 212.

In other embodiments, the qubit inductive element 215 could be placed within the second loop 216 (e.g., between Josephson junctions 214). In certain embodiments, a qubit may include multiple indicative elements (e.g. one in each of its two loops). Those skilled in the art will understand that each loop of a qubit has a finite self-inductance to which other loops can couple via a mutual inductance. By coupling to a loop with the larger junctions (e.g., loop 212 in FIG. 2), this is effectively coupling to a operator, while the loop with the smaller junctions (e.g., loop 216 in FIG. 2) is effectively coupling to an X operator.

It should be understood that the concepts and structures sought to be protected herein are not limited to the qubit structure shown in FIG. 2. For example, in some embodiments, any qubit which has a state-dependent magnetic moment can be used. The illustrative mSQUID 204 includes the transformer 206, a multiloop circuit 208 inductively coupled thereto, and an output 228. The transformer 206 may include a Josephson junction pair 218, as shown. Including Josephson junctions in the transformer can allow flux to enter and leave the transformer loop when it is cooling (so that flux is not trapped, as would happen in a closed superconducting loop). Josephson junction pair 218 may also allow the transformer 206 to be tunable.

The multiloop circuit 208 includes a plurality of loops 220a-220n (220 generally), each having a Josephson junction pair 222, an inductive element (e.g., a linear or non linear inductive element) 224 to provide inductive coupling to the transformer 206, and an energy storage element 226 (e.g., a capacitor) arranged in parallel with one of the loop Josephson junctions. To promote clarity in the figure, the Josephson junction pair, inductive element, and energy storage element are labeled only for a first loop 220a.

It should be understood that the number of loops 220 within the circuit 208 may be selected based on requirements for a given application. In particular, the number of loops 220 determines the number of free parameters that can be used to define the shape of mSQUID's nonlinear energy vs. flux characteristic. Thus, increasing the number of loops 200 may provide additional control required for a given application. However, it will be appreciated that increasing the number of loops 200 may require more flux from the transformer 206 for the mSQUID to function.

It will be appreciated that the design of each mSQUID loop 220 is based on that of a conventional DC SQUID, hence the name mSQUID (or multiloop SQUID). As is known, the effective Josephson potential energy of a DC SQUID can be modulated by changing the relative gauge-invariant phase between the two Josephson junctions, adjusted via the magnetic flux through the respective loop. In the case of a multiloop SQUID 204, an arbitrary potential energy function vs. uniform flux can be realized by adjusting the individual flux bias through the multispin coupler loops 220. In particular, the constant phase offset between each Josephson junction can be controlled to realize arbitrary potential energy function vs. uniform flux. The result is that for flux $\Phi$ coupled to a common transformer and applied equally to all loops 220 of the mSQUID 204, an arbitrary potential energy function U($\Phi$) can be engineered by appropriately tuning the offset fluxes applied to the individual loops 222.

In operation, each qubit 202 nominally produces a state-dependent flux$\pm\Phi_q$ through the transformer 206. For N qubits 202 coupled to transformer 206, the total qubit-state-dependent flux (i.e., the total state-dependent flux from all qubits, which is the input to the mSQUID) then takes one of the N+1 different values: $\Phi_k \varepsilon \Phi_q$ {−N, −N+2 ... 0 ... N−2, N}.

It is appreciated herein the mSQUID 204 can be dynamically adjusted such that it behaves like a current source: $(\Phi)=I\Phi$, an inductor: $U(\Phi)=\Phi^2/2L$, or any more complicated nonlinear magnetic element whose behavior can be expressed as a potential energy U($\Phi$) (the classical parameters I, L, etc. are related to the Taylor expansion coefficients of the energy vs. flux characteristic about a chosen bias point). Furthermore, since the internal Josephson frequencies of the multispin coupler 204 can be kept relatively large (>100 GHz), this electrical behavior can be preserved over an extremely wide frequency range. As a result, the mSQUID 204 may be used in parametric nonlinear quantum devices—such as amplifiers and frequency converters—that conventionally rely on the "bare" Josephson nonlinearity, which is relatively weak by comparison.

Figure 3:
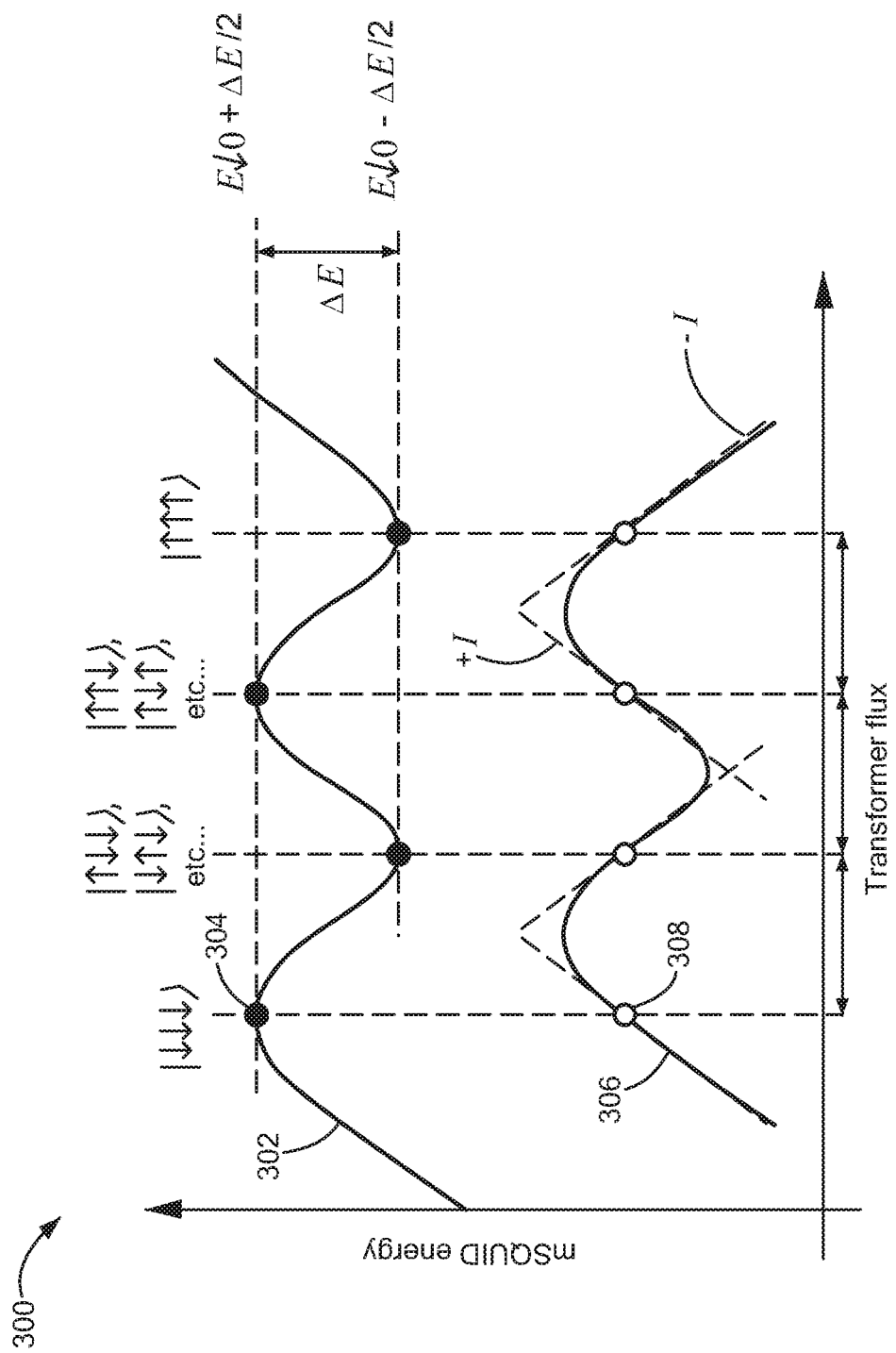
FIG. 3 is a graph illustrating different modes of mSQUID operation, according to embodiments of the disclosure.

Referring to FIG. 3, in various embodiments, an mSQUID (e.g., mSQUID 204 in FIG. 2) can be operated in two different modes: energy mode and current mode. In energy mode, the potential energy within the mSQUID's multiloop circuit is proportional to the N-qubit parity operator $\hat{P}_N \equiv \Pi_{i=1}^N \hat{\sigma}_i^z$ such that: $\hat{U}(\Phi_k) = \Delta E \cdot \hat{P}_N$, where $\hat{\sigma}_i^z$ is the Z operator for the ith qubit. In current mode, the total current circulating within the mSQUID's multiloop circuit is proportional to the N-qubit parity operator $\hat{P}_N \equiv \Pi_{i=1}^N \hat{\sigma}_i^z$ such that $\hat{I}(\Phi_k) = I_m \hat{P}_N$. In some embodiments, the mSQUID 204 can be configured to operate in a given mode by adjusting the magnetic flux through the mSQUID loops 220, as discussed above.

The graph 300 in FIG. 3 illustrates these two modes of mSQUID operation. The top curve 302 illustrates energy mode, wherein the total potential energy as a function of possible qubit flux values (denoted by circles along the curve 302, e.g., circle 304) is effectively proportional to a multispin (in this case, three-spin) operator: $\hat{U} = \Delta E \hat{\sigma}_1^z \hat{\sigma}_2^z \hat{\sigma}_3^z$. In energy mode, the potential energy vs. input flux can be tailored such that at the flux points accessible via the qubits' input to the transformer, the mSQUID energy takes on one of two values, according to the total parity of the qubit state. This results in an effective interaction between the qubits.

The bottom curve 306 illustrates the current mode of operation, in which the potential energy is the same at all of the possible qubit flux values (denoted by circles along the curve 306, e.g., circle 308), but the mSQUID circulating current (proportional to the slope of the energy vs. flux) is proportional to a multiqubit operator: $\hat{I} = I \hat{\sigma}_1^z \hat{\sigma}_2^z \hat{\sigma}_3^z$. In current mode, the potential energy is kept constant and independent of the qubits' input state, while the effective mSQUID circulating current (which is given by the derivative of the energy with respect to the flux) assumes only two values, and is proportional to the total qubit state parity.

It should be understood that although FIG. 3 illustrates mSQUID operation for the case of three (3) qubits, the concepts, structures, and techniques sought to be protected herein be used to effect interactions between arbitrary numbers of qubits (e.g., between N qubits, where N>1).

Figure 4:
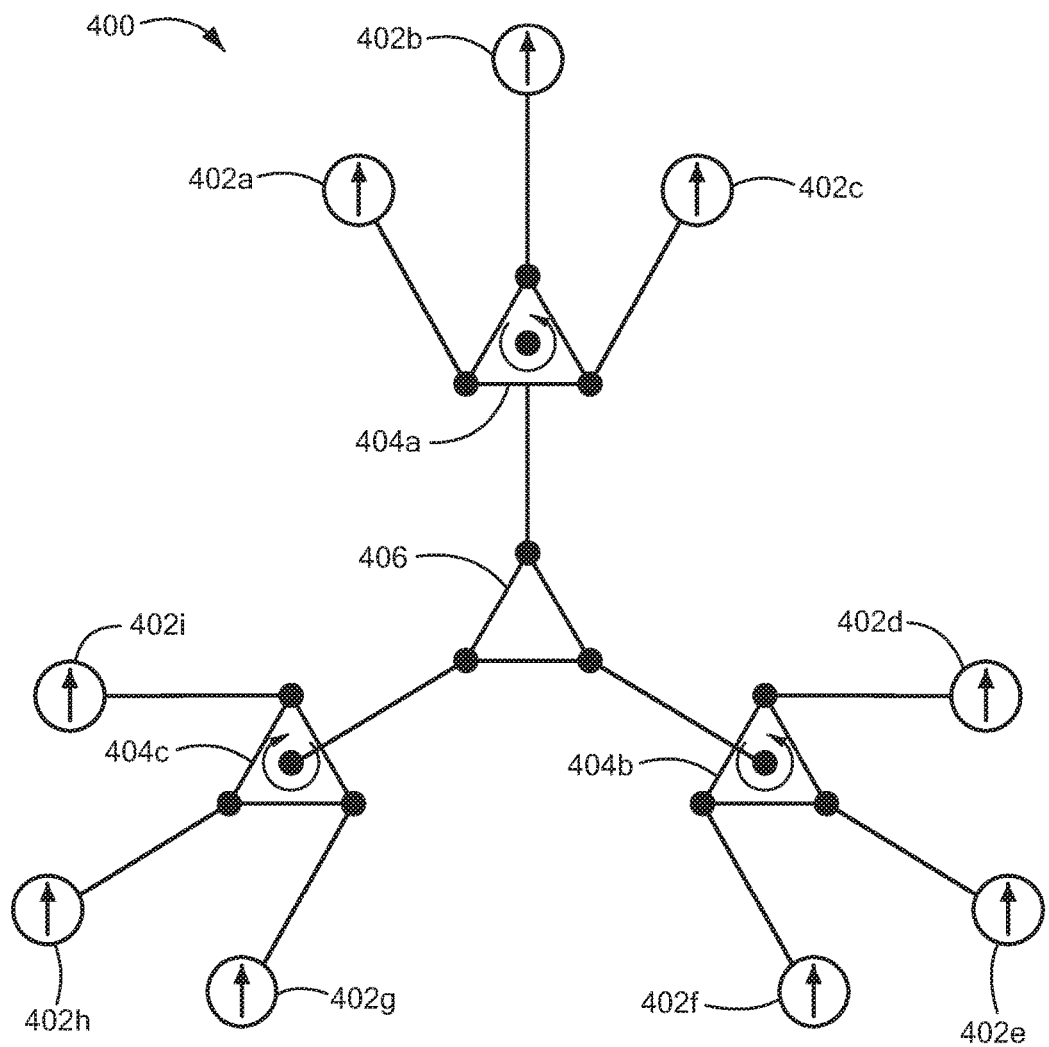
FIG. 4 is a diagram of an inverse paramagnetic tree structure to provide multiqubit interactions.

FIG. 4 illustrates how the different modes of mSQUID operation can be combined using a so-called "inverse paramagnetic tree" structure to provide higher-order multiqubit interactions. An inverse paramagnetic tree structure 400 may include a root mSQUID 406, a plurality of intermediate mSQUIDs (e.g., intermediate mSQUIDs 404a) coupled thereto, and a plurality of qubits (e.g., qubit 402a) coupled to each of the intermediate mSQUIDs. In the embodiment of FIG. 4, the structure 400 includes three (3) intermediate mSQUIDs 404a-404c, each having a group of three (3) qubits (or "spins") 402 coupled thereto. In particular, qubits 402a-402c are coupled to a first intermediate mSQUID 404a, qubits 402d-402f are coupled to a second intermediate mSQUID 404b, and qubits 402g-402i are coupled to a third intermediate mSQUID 404c.

The root mSQUID 406 may be operated in a different mode than the intermediate mSQUIDs 404. For example, each group of M (e.g., M=3) qubits 402 may be coupled to a respective intermediate mSQUID 404 operating in current mode, such that the total circulating current in each intermediate mSQUID 404 is proportion to a M-qubit operator product, with M=3 in FIG. 4. In turn, each intermediate mSQUID 404 may be coupled to a root mSQUID 406 operating in energy mode, such that the total energy in the root mSQUID 406 is proportional to an N-qubit operator product, with N=9 in FIG. 4. Thus, it will be appreciated that the parities of multiple groups of M qubits 402 can be combined, resulting in an effective interaction between all N qubits.

It should be understood that the tree structure 400 shown in FIG. 4 is merely one example and that an inverse paramagnetic tree structure 400 could include additional levels (i.e., more than one level of intermediate mSQUIDs 404) and could have more than three (3) connections at each levels of the tree. Moreover, the number of connections at each level may vary in some embodiments. For example, the root mSQUID could be coupled to a certain number of intermediate mSQUIDs, each of which could be coupled to a different number of qubits. Further, the structure 400 can be used to realize either X or Z operators by connecting to either the Z or X loops of the qubits 402.

It is appreciated that the concepts, structures, and techniques described herein may be used to provide high-order qubit interactions and, as such, could have transformational importance in both quantum annealing and in digital quantum information processing.

All references cited herein are hereby incorporated herein by reference in their entirety.

Having described certain embodiments, which serve to illustrate various concepts, structures, and techniques sought to be protected herein, it will be apparent to those of ordinary skill in the art that other embodiments incorporating these concepts, structures, and techniques may be used. Elements of different embodiments described hereinabove may be combined to form other embodiments not specifically set forth above and, further, elements described in the context of a single embodiment may be provided separately or in any suitable sub-combination. Accordingly, it is submitted that the scope of protection sought herein should not be limited to the described embodiments but rather should be limited only by the spirit and scope of the following claims.

What is claimed is:

1. A system for multiqubit interaction between a plurality of qubits, the system comprising:
   a multispin coupler, inductively coupled to each of the plurality of qubits and including a plurality of loops, each loop having a pair of Josephson junctions, the multispin coupler having a potential energy that is a desired, non-linear function of a magnetic flux of the plurality of qubits, obtained by adjusting one or more magnetic fluxes that pass through a respective one or more of the plurality of loops.

2. The system of claim 1 wherein each loop of the multispin coupler includes an inductive element coupled between the pair of Josephson junctions and an energy storage element arranged in parallel with a first one of the pair of Josephson junctions.

3. The system of claim 1 wherein the multispin coupler further includes a transformer inductively coupled to each of the plurality of qubits and to each loop of the multispin coupler.

4. The system of claim 1 wherein each of the plurality qubits includes a first loop and a second loop, the first and second loop each including a pair of Josephson junctions, the first loop further including an inductive element coupled between the pair of Josephson junctions.

5. The system of claim 1 wherein the plurality of qubits includes three or more qubits.

6. The system of claim 1 wherein the multispin coupler can be configured to operate in either an energy mode or a current mode, wherein in energy mode a total potential energy within the multispin coupler is proportional to a parity operator over each of the plurality of qubits, wherein current mode a total current circulating within the multispin coupler is proportional to the parity operator over each of the plurality of qubits.

7. The system of claim 6 wherein the multispin coupler can be configured to operate in either an energy mode or a current mode by adjusting a magnetic flux through one or more of the loops of the multispin coupler.

8. A system for multiqubit interaction between a plurality of qubits, the system comprising:
   a first multispin coupler; and
   a plurality of second multispin couplers each inductively coupled to the first multispin coupler and a different one or more of the plurality of qubits, wherein the first multispin coupler and each of the plurality of second multispin couplers include a plurality of loops, each loop having a pair of Josephson junctions, wherein the first multispin coupler and each of the plurality of second multispin couplers have a potential energy that is a desired, non-linear function of an input magnetic flux, obtained by adjusting one or more magnetic fluxes that pass through a respective one or more of the plurality of loops.

9. The system of claim 8
   wherein each of the plurality of second multispin couplers is configured to operate in an energy mode whereby a total potential energy within each of the plurality of second multispin couplers is proportional to a parity operator over each of the plurality of qubits coupled thereto; and
   wherein the first multispin coupler is configured to operate in a current mode whereby a total current circulating within the first multispin coupler is proportional to a parity operator over each of the plurality of qubits coupled to each of the plurality of second multispin couplers.

10. The system of claim 8
    wherein each of the plurality of second multispin couplers is configured to operate in a current mode whereby a total current circulating within each of the plurality of second multispin couplers is proportional to a parity operator over each of the plurality of qubits coupled thereto, and
    wherein the first multispin coupler is configured to operate in an energy mode whereby the total potential energy within the first multispin coupler is proportional to a parity operator over each of the plurality of qubits coupled to each of the plurality of second multispin couplers.

* * * * *